United States Patent
Oya et al.

(10) Patent No.: US 12,235,580 B2
(45) Date of Patent: Feb. 25, 2025

(54) METHOD FOR PRODUCING A LITHOGRAPHY COATING FILM FORMING-COMPOSITION

(71) Applicant: NISSAN CHEMICAL CORPORATION, Tokyo (JP)

(72) Inventors: Takumi Oya, Toyama (JP); Hiroki Yamaguchi, Toyama (JP); Suguru Sassa, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 930 days.

(21) Appl. No.: 17/345,631

(22) Filed: Jun. 11, 2021

(65) Prior Publication Data

US 2022/0011671 A1 Jan. 13, 2022

(30) Foreign Application Priority Data

Jul. 10, 2020 (JP) .................................. 2020-119163

(51) Int. Cl.
| | | |
|---|---|---|
| *G03F 7/11* | (2006.01) | |
| *B01J 39/20* | (2006.01) | |
| *B01J 41/13* | (2017.01) | |
| *C09D 125/18* | (2006.01) | |
| *C09D 163/00* | (2006.01) | |

(52) U.S. Cl.
CPC ................. *G03F 7/11* (2013.01); *B01J 39/20* (2013.01); *B01J 41/13* (2017.01); *C09D 125/18* (2013.01); *C09D 163/00* (2013.01)

(58) Field of Classification Search
USPC .......................................................... 521/26
See application file for complete search history.

(56) References Cited

U.S. PATENT DOCUMENTS

| | | |
|---|---|---|
| 5,702,611 A | 12/1997 | Gronbeck et al. |
| 5,955,570 A | 9/1999 | Rahman et al. |
| 6,043,002 A | 3/2000 | Rahman |
| 2008/0182913 A1 | 7/2008 | Higuchi et al. |
| 2012/0271065 A1 | 10/2012 | Haga et al. |
| 2013/0017376 A1* | 1/2013 | Okuyama ............... G03F 7/038 430/296 |
| 2016/0068709 A1* | 3/2016 | Endo ........................ G03F 7/091 524/597 |
| 2016/0279578 A1 | 9/2016 | Ishikawa et al. |
| 2020/0384383 A1 | 12/2020 | Takada et al. |

FOREIGN PATENT DOCUMENTS

| | | |
|---|---|---|
| JP | S62-042748 A | 2/1987 |
| JP | H01-119344 A | 5/1989 |
| JP | H01-119345 A | 5/1989 |
| JP | H03-052649 A | 3/1991 |
| JP | H09-206744 A | 8/1997 |
| JP | H11-114432 A | 4/1999 |
| JP | H11-133619 A | 5/1999 |
| JP | H11-226432 A | 8/1999 |
| JP | 2001-114717 A | 4/2001 |
| JP | 2001-296285 A | 10/2001 |
| JP | 2004-136231 A | 5/2004 |
| JP | 2004-181351 A | 7/2004 |
| JP | 2004-181352 A | 7/2004 |
| JP | 2007-117781 A | 5/2007 |
| JP | 2009-057286 A | 3/2009 |
| JP | 2010-099613 A | 5/2010 |
| JP | 2010-234339 A | 10/2010 |
| JP | 2011-072963 A | 4/2011 |
| JP | 2011-169723 A | 9/2011 |
| JP | 2016-180055 A | 10/2016 |
| JP | 2017-100112 A | 6/2017 |
| JP | 2018-034095 A | 3/2018 |
| WO | 2007/043278 A1 | 4/2007 |
| WO | 2007/058251 A1 | 5/2007 |
| WO | 2011/096448 A1 | 8/2011 |
| WO | 2017/116759 A1 | 7/2017 |
| WO | 2019/123718 A1 | 6/2019 |
| WO | 2019/131629 A1 | 7/2019 |

OTHER PUBLICATIONS

Machine-generated English translation of JPWO2007/058251A1, 32 pages; retrieved from ESPACENET on Aug. 28, 2024. (Year: 2009).*
Product Specification Sheet for Acetone, Anhydrous, VWR Chemicals, p. 1/1 (undated).*
Feb. 16, 2022 Office Action issued in Finnish U.S. Appl. No. 20/215,686.
Mar. 5, 2024 Office Action Issued in Japanese Patent Application No. 2020-119163.
Jun. 13, 2024 Office Action issued in Japanese Patent Application No. 2020-119163.

* cited by examiner

*Primary Examiner* — Fred M Teskin
(74) *Attorney, Agent, or Firm* — Oliff PLC

(57) ABSTRACT

A method for producing an ion-exchange resin having a water content of 5% by weight or less, a method for producing a lithography coating film forming-composition using the ion-exchange resin, and a method for washing the ion-exchange resin. The methods include the step of passing an organic solvent having a water content of 150 ppm or less through an ion-exchange resin precursor having a water content of 40% by weight or more, where a dehydration efficiency defined by the following equation is 5 or more: Dehydration efficiency=Dehydration rate (%)/[Weight of the organic solvent used per unit weight of the ion-exchange resin precursor (kg/kg)×Washing time (h)].

9 Claims, No Drawings

METHOD FOR PRODUCING A LITHOGRAPHY COATING FILM FORMING-COMPOSITION

TECHNICAL FIELD

The present invention relates to a method for producing a lithography coating film forming-composition (for example, a resist underlayer film forming-composition) having a reduced water content for use in the lithography step in the production of a semiconductor, and a method for washing an ion-exchange resin having a reduced water content used for producing the composition.

BACKGROUND ART

With respect to the lithography step in the production of a cutting-edge semiconductor having a wiring of 20 nm or less and others, the composition used for forming a coating film for lithography (lithography coating film forming-composition) is required to have as low a water content as possible for preventing defects in a semiconductor substrate. Patent Literature 1 discloses an ion-exchange resin having a water content of 30% or less and a method for purifying the ion-exchange resin.

CITATION LIST

Patent Literature

Patent Literature 1: JP 2007-117781 A

SUMMARY OF INVENTION

Technical Problem

In the production process for the lithography coating film forming-composition, ion-exchange purification using an ion-exchange resin is often conducted for the purpose of reducing metal impurities. However, there has been a problem in that water derived from a commercially available ion-exchange resin is mixed into the product of the composition, making it difficult to reduce the water content of the ultimate product of the composition. For reducing the amount of water derived from an ion-exchange resin, the so-called batch pretreatment for the ion-exchange resin has been conducted. In the batch pretreatment, the ion-exchange resin is subjected to solvent displacement by pouring it into an organic solvent having a low water content. However, this treatment method has a problem in that it requires a prolonged period of time, lowering the production efficiency of the lithography coating film forming-composition.

For solving the above-mentioned problems, the present invention provides a method for producing a lithography coating film forming-composition having a reduced water content for use in the lithography step in the production of a semiconductor, and a method for washing an ion-exchange resin having a reduced water content used for producing the composition.

Solution to Problem

The present invention embraces the followings.

[1] A method for producing an ion-exchange resin having a water content of 5% by weight or less, comprising the step of passing an organic solvent having a water content of 150 ppm or less through an ion-exchange resin precursor having a water content of 40% by weight or more,
wherein a dehydration efficiency defined by the following equation is 5 or more:

Dehydration efficiency=Dehydration rate (%)/
[Weight of the organic solvent used per unit weight of the ion-exchange resin precursor (kg/kg)×Washing time (h)].

[2] The method for producing an ion-exchange resin having a water content of 5% by weight or less according to item [1], wherein, in the step of passing an organic solvent, the organic solvent is passed in a rate of passing of 3 ($h^{-1}$) or less, in terms of a space velocity based on an ion-exchange resin-filled layer volume.

[3] A method for producing a lithography coating film forming-composition, comprising the step of subjecting a lithography coating film forming-composition precursor to ion-exchange treatment using the ion-exchange resin having a water content of 5% by weight or less produced by the method according to item [1] or [2].

[4] The method for producing a lithography coating film forming-composition according to item [3], wherein the lithography coating film forming-composition after the step of passing through the precursor has a water content of 0.3% by weight or less.

[5] The method for producing a lithography coating film forming-composition according to item [3] or [4], wherein the lithography coating film forming-composition comprises a polymer.

[6] The method for producing a lithography coating film forming-composition according to any one of items [3] to [5], wherein the lithography coating film forming-composition further comprises at least one member selected from the group consisting of a crosslinkable compound, a crosslinking catalyst, and a surfactant.

[7] The method for producing a resist underlayer film forming-composition according to any one of items [3] to [6], wherein the lithography coating film forming-composition is a resist underlayer film forming-composition.

[8] A method for washing an ion-exchange resin, comprising the step of passing an organic solvent having a water content of 150 ppm or less through the ion-exchange resin,
wherein a dehydration efficiency defined by the following equation before and after washing the ion-exchange resin is 5 or more:

Dehydration efficiency=Dehydration rate (%)/
[Weight of the organic solvent used per unit weight of the ion-exchange resin precursor (kg/kg)×Washing time (h)].

[9] A method for producing a lithography coating film forming-composition, comprising the step of subjecting a lithography coating film forming-composition precursor to ion-exchange treatment using the ion-exchange resin washed by the method according to item [8].

[10] The method for producing a lithography coating film forming-composition according to item [9], wherein the lithography coating film forming-composition after the step for ion-exchange treatment has a water content of 0.3% by weight or less.

DESCRIPTION OF EMBODIMENTS

<Method for Producing an Ion-Exchange Resin, and Method for Washing an Ion-Exchange Resin>

The present invention relates to a method for producing an ion-exchange resin having a water content of 5% by weight or less, comprising the step of passing an organic solvent having a water content of 150 ppm or less through an ion-exchange resin precursor having a water content of 40% by weight or more, wherein a dehydration efficiency defined by the following equation is 5 or more:

Dehydration efficiency=Dehydration rate (%)/
[Weight of the organic solvent used per unit
weight of the ion-exchange resin precursor (kg/kg)×Washing time (h)].

It also relates to a method for washing an ion-exchange resin, comprising the step of passing an organic solvent having a water content of 150 ppm or less through the ion-exchange resin, wherein a dehydration efficiency defined by the following equation before and after washing the ion-exchange resin is 5 or more:

Dehydration efficiency=Dehydration rate (%)/
[Weight of the organic solvent used per unit
weight of the ion-exchange resin precursor (kg/kg)×Washing time (h)].

Usually, a commercially available ion-exchange resin has been finally subjected to washing step using water. Therefore the whole of the product of ion-exchange resin typically has a water content of 40% by weight or more. When the ion-exchange resin is used as it is in the purification step for a lithography coating film forming-composition precursor, the ion-exchange resin accompanies water, so that the ultimate product of a lithography coating film forming-composition inevitably contains water in an amount of, for example, several %. For reducing the amount of water brought with such an ion-exchange resin, the so-called batch treatment is conducted. In the batch treatment, the ion-exchange resin is subjected to solvent displacement by pouring it into an organic solvent having a low water content. However, this treatment method has a problem in that it requires a prolonged period of time.

The method for producing an ion-exchange resin of the present invention comprises the step of passing an organic solvent having a water content of 150 ppm or less through an ion-exchange resin precursor having a water content of 40% by weight or more.

The better the lower water content of the organic solvent. The water content of the organic solvent is preferably 150 ppm or less, 130 ppm or less, 100 ppm or less, 80 ppm or less, 70 ppm or less, 60 ppm or less, 50 ppm or less, 40 ppm or less, 30 ppm or less, 20 ppm or less, 10 ppm or less, 5 ppm or less, 3 ppm or less, 1 ppm or less, and the detection limit or less.

The water content of the organic solvent can be measured, for example, by means of a Karl Fischer moisture content meter.

The method for producing an ion-exchange resin of the present invention is not conducted in a batchwise manner, but it is conducted by filling a column with the water-containing ion-exchange resin (untreated) (i.e., ion-exchange resin precursor) according to the present invention and passing the above-mentioned organic solvent through the column. Thereby, it can produce an ion-exchange resin having a water content efficiently reduced, specifically a water content of 5% by weight or less, 4% by weight or less, 3% by weight or less, or 2% by weight or less, more preferably 1% by weight or less. The frequency of passing the organic solvent through the column is usually one, but may be two or more if necessary.

The method for producing an ion-exchange resin of the present invention has a dehydration efficiency of 5 or more. The dehydration efficiency is defined by the following equation.

Dehydration efficiency=Dehydration rate (%)/
[Weight of the organic solvent used per unit
weight of the ion-exchange resin precursor (kg/kg)×Washing time (h)]

For example, in Example 1 described below, a calculation is made as follows.

Dehydration efficiency=94(%)/[8 (kg/kg)×
2 (h)]=5.875

<Ion-Exchange Resin>

An example of the ion-exchange resin according to the present invention is an ion-exchange resin having an ion-exchange group fixed on the surface of a porous carrier comprising a styrene-divinylbenzene copolymer. According to the type of the ion-exchange group fixed to the resin, ion-exchange resins are classified into, for example, a strongly acidic ion-exchange resin and a weakly acidic ion-exchange resin. Examples of strongly acidic ion-exchange groups include a sulfonic group. Examples of weakly acidic ion-exchange groups include a carboxyl group, a phosphonic acid group, a phosphinic acid group, an arsenious acid group, and a phenoxide group. Further, according to the physical properties of the carrier, the ion-exchange resins are classified into, for example, a gel type and a micro-reticular (MR) type, the latter having been made porous by forming pores in a gel type resin. There is no particular limitation to the ion-exchange resin as long as it has a dehydration efficiency of 5 or more and a water content of 5% by weight or less, and commercially available ion-exchange resins may be used.

<Organic Solvent>

There is no particular limitation to the organic solvent in the present invention, as long as it can wash the ion-exchange resin in the step of passing the organic solvent, and any of such solvents may be used. Preferred is an organic solvent usually used in the semiconductor lithography step. Particularly, because the lithography coating film forming-composition and the lithography coating film forming-composition precursor according to the present invention are used in a uniform solution state, and, taking the application properties of the composition into consideration, it is recommended that an organic solvent usually used in the lithography step be used.

Examples of the organic solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, N,N-dimethylacetamide, alcohols, such as methanol, ethanol, propanol, and butanol, ether solvents, such as tetrahydrofuran and dioxane, and acetone. The solvent may be used each alone or in combination of two or more.

Of these solvents, preferred are propylene glycol monomethyl ether, propylene glycol monomethyl ether acetate, ethyl lactate, butyl lactate, and cyclohexanone. Especially preferred are propylene glycol monomethyl ether and propylene glycol monomethyl ether acetate.

It is preferred that, in the step of passing the organic solvent, the rate of passing the organic solvent is 3 ($h^{-1}$) or less, in terms of a space velocity based on the ion-exchange resin-filled layer volume.

The space velocity is calculated by the following equation.

Space velocity ($h^{-1}$)=Washing liquid flow rate (L/h)/ Resin-filled layer volume (L)

For example, in Example 1 described below, a calculation is made as follows.

Space velocity=105 (L/h)/35 (L)=3 ($h^{-1}$)

<Method for Producing a Lithography Coating Film Forming-Composition>

The method for producing a lithography coating film forming-composition of the present invention comprises the step of passing a lithography coating film forming-composition precursor through an ion-exchange resin having a water content of 5% by weight or less produced by the above-described method or washed by the above-described method.

It also comprises the step of subjecting a lithography coating film forming-composition precursor to ion-exchange treatment using the ion-exchange resin having a water content of 5% by weight or less produced by the above-described method or washed by the above-described method.

The amount of the ion-exchange resin used relative to 1 kg of the lithography coating film forming-composition precursor is, for example, 0.1 kg or less.

The term "lithography coating film forming-composition precursor" used here means a lithography coating film forming-composition before subjected to ion-exchange resin treatment.

<Lithography Coating Film Forming-Composition and Precursor Thereof>

The lithography coating film forming-composition used in the present invention and the precursor thereof are the composition before being passed through the above-mentioned ion-exchange resin, usually filled in a column or packed in a filter cartridge. For example, the lithography coating film forming-composition and the precursor thereof include the below-described photoresist composition, resist underlayer film forming-composition (containing an organic compound and/or an inorganic compound), protective film forming-composition for protecting a substrate from an etching liquid during processing of a semiconductor substrate, lower-layer film forming-composition for a directed self-assembled film, upper-layer film forming-composition for a directed self-assembled film, and resist upper-layer film forming-composition. However, they are not limited to these compositions.

The wavelength for exposure in the lithography step may be an i-line, a KrF excimer laser, an ArF excimer laser, an EUV (extreme ultraviolet light), or an EB (electron beam).

In addition, the composition and precursor may be the resist upper-layer film forming-composition for a resist upper-layer film described in, for example, WO2014/115843 and WO2015/129486; the lower-layer film forming-composition for a directed self-assembled film utilizing a direct self assembly (DSA) technique of a block copolymer described in, for example, WO2013/146600 and WO2014/097993; the upper-layer film forming-composition for a directed self-assembled film described in, for example, WO2018/051907; or the coating composition for pattern inversion described in, for example, WO2016/031563.

Examples of the precursors include a photoresist composition (positive and negative) for a known photoresist film formed through application to a semiconductor wafer preferably by spin coating and the baking step, a resist underlayer film forming-composition (containing an organic compound and/or an inorganic compound) for a known resist underlayer film, a protective film forming-composition for a known semiconductor substrate protective film for use in wet etching a known semiconductor substrate, a resist upper-layer film forming-composition for a known resist upper-layer film, a lower-layer film forming-composition for a known directed self-assembled film, and an upper-layer film forming-composition for a known directed self-assembled film. Preferred is a protective film forming-composition or a resist underlayer film forming-composition. Preferred is a resist underlayer film forming-composition. Preferred is a resist underlayer film forming-composition for ArF, EUV, or EB. Preferred is a lower-layer film forming-composition for a directed self-assembled film. Preferred is an upper-layer film forming-composition for a directed self-assembled film. Preferred is a resist upper-layer film forming-composition for EUV. Preferred is a coating composition for pattern inversion.

Examples of resist underlayer film forming-compositions include the protective film forming-composition, resist underlayer film forming-composition, and silicon-containing resist underlayer film forming-composition that are described in, for example, WO2009/096340, JP 2009-053704 A, WO2010/147155, WO2011/102470, WO2013/047516, WO2015/030060, WO2018/052130, WO2019/124474, WO2019/124475, WO2019/151471, PCT/JP2019/042708, PCT/JP2020/001627, and Japanese Patent Application No. 2019-088345.

Each of the lithography coating film forming-composition and the lithography coating film forming-composition precursor according to the present invention usually has a solid content of 0.1 to 70% by mass, preferably 0.1 to 60% by mass, preferably 0.1 to 40% by mass. The solid content indicates a content of the solids remaining after removing the solvent from the all components of the lithography coating film forming-composition or the precursor. The proportion of the polymer in the solids is, for example, within the range of 1 to 100% by mass, 2 to 100% by mass, 3 to 100% by mass, 4 to 100% by mass, 5 to 100% by mass, 10 to 100% by mass, 30 to 100% by mass, 50 to 100% by mass, 6 to 100% by mass, 1 to 99.9% by mass, 50 to 99.9% by mass, 50 to 95% by mass, or 50 to 90% by mass.

<Polymer>

Each of the lithography coating film forming-composition used in the present invention and the precursor thereof preferably comprises an organic solvent and a polymer having a weight average molecular weight of 800 or more.

The organic solvent is the same as the <Organic solvent> mentioned above. However, the lithography coating film forming-composition and the lithography coating film forming-composition precursor according to the present invention are used in a uniform solution state, and, taking the application properties of the composition into consideration, it is recommended that an organic solvent usually used in the lithography step be used.

As an example of specific structure of the polymer, the polymer preferably has a unit represented by the following formula (01):

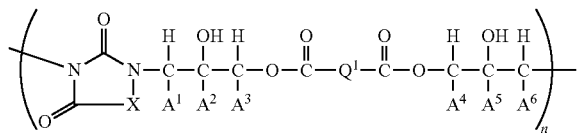

The polymer in the present invention, for example, includes the polymer disclosed in WO 2009/096340 A1, and the reaction product of a bi- or higher-functional compound having at least one disulfide linkage and a tri- or higher-functional compound disclosed in WO 2019/151471 A1, but the polymer is not limited to these examples.

When the polymer is a reaction product of a bifunctional compound (A) having at least one disulfide linkage and a bifunctional compound (B) different from compound (A), the disulfide linkage is present in the principal chain of the polymer.

The polymer may have a repeating unit represented by the following formula (1):

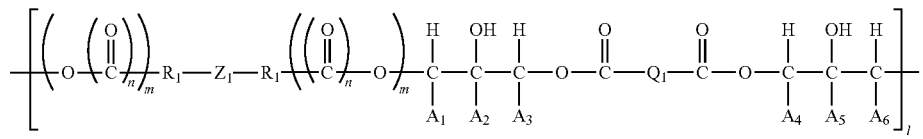

wherein X represents a group represented by the following formula (02), (03), or (04):

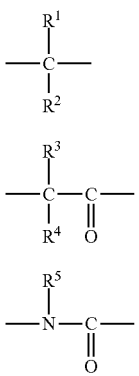

wherein each of $R^1$ to $R^5$ independently represents a hydrogen atom, an alkyl group having 1 to 6 carbon atoms, an alkenyl group having 2 to 6 carbon atoms, a benzyl group, or a phenyl group, wherein the phenyl group is optionally substituted with at least one group selected from the group consisting of an alkyl group having 1 to 6 carbon atoms, a halogen atom, an alkoxy group having 1 to 6 carbon atoms, a nitro group, a cyano group, and an alkylthio group having 1 to 6 carbon atoms, and $R^1$ and $R^2$, and $R^3$ and $R^4$ are optionally bonded together to form a ring having 3 to 6 carbon atoms, each of $A^1$ to $A^6$ independently represents a hydrogen atom, a methyl group, or an ethyl group, $Q^1$ represents a divalent group containing a disulfide linkage, preferably represents a divalent group containing an alkylene group having 1 to 6 carbon atoms at each of the both ends of a disulfide linkage, and n represents an integer of 5 to 100, which indicates the number of repeating units.

wherein $R_1$ represents an alkyl group having 0 to 1 carbon atom, n represents an integer of 0 or 1, which indicates the number of repeating unit, m represents an integer of 0 or 1, $Z_1$ represents the following formula (2), (3), or (2-1):

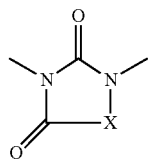

wherein, in formula (3) above, X is a group represented by the following formula (4), (51), or (6):

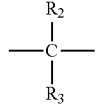

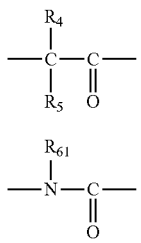

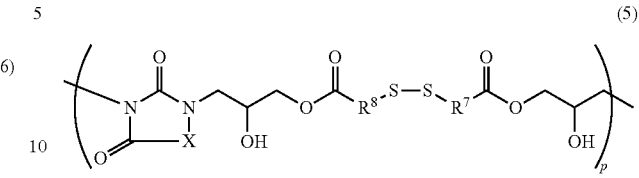

wherein each of $R_2$, $R_3$, $R_4$, $R_5$, and $R_{61}$ independently represents a hydrogen atom, an alkyl group having 1 to 6 carbon atoms, an alkenyl group having 3 to 6 carbon atoms, a benzyl group, or a phenyl group, wherein the phenyl group is optionally substituted with at least one group selected from the group consisting of an alkyl group having 1 to 6 carbon atoms, a halogen atom, an alkoxy group having 1 to 6 carbon atom, a nitro group, a cyano group, and an alkylthio group having 1 to 6 carbon atoms, and $R_2$ and $R_3$, and $R_4$ and $R_5$ are optionally bonded together to form a ring having 3 to 6 carbon atoms, each of $A_1$ to $A_6$ independently represents a hydrogen atom, a methyl group, or an ethyl group, $Q_1$ represents an alkylene group having 1 to 10 carbon atoms and being interrupted by a disulfide linkage, and l represents an integer of 5 to 100, which indicates the number of repeating units.

$Q_1$ is preferably an alkylene group having 2 to 6 carbon atoms and being interrupted by a disulfide linkage.

Examples of the "rings having 3 to 6 carbon atoms" include cyclopropane, cyclobutane, cyclopentane, cyclopentadiene, and cyclohexane.

Formula (01) above may be represented by the following formula (5):

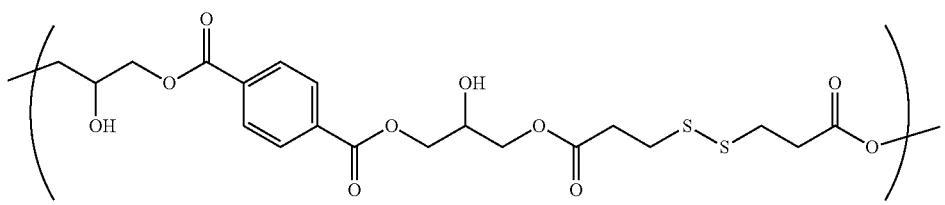

wherein X represents a group represented by formula (4), (51), or (6) above, each of $R^6$ and $R^7$ independently represents an alkylene group having 1 to 3 carbon atoms or a direct bond, and p represents an integer of 5 to 100, which indicates the number of repeating units.

The polymer in the present invention is preferably represented by the following (Formula P-6) to (Formula P-8).

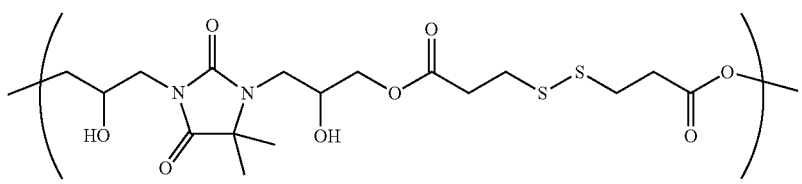

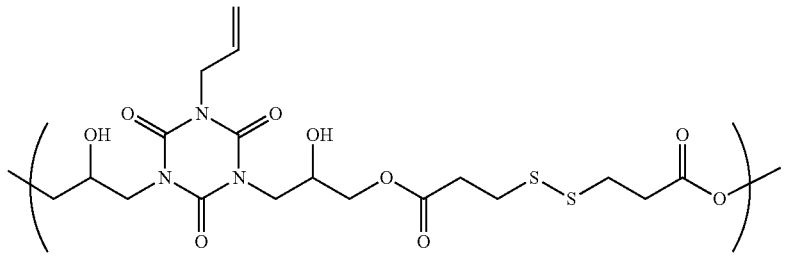

The polymer is preferably a reaction product synthesized according to a known method by reacting a bi- or higher-functional compound (A) having at least one disulfide linkage and a bi- or higher-functional compound (B).

Examples of the alkyl groups having 1 to 6 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the alkenyl groups having 2 to 6 carbon atoms include a vinyl group, an allyl group, a propenyl group, a butenyl group, a hexenyl group, and a cyclohexenyl group.

Examples of alkoxy groups having 1 to 6 carbon atoms include a methoxy group, an ethoxy group, a n-propoxy group, an isopropoxy group, a n-butoxy group, a t-butoxy group, a cyclopentyloxy group, and a cyclohexyloxy group.

Examples of the alkylthio groups having 1 to 10 carbon atoms include an ethylthio group, a butylthio group, a hexylthio group, and an octylthio group.

Examples of the alkylene groups having 1 to 6 carbon atoms include divalent organic groups corresponding to the above-mentioned alkyl groups, such as a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, a n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, and a 2-ethyl-3-methyl-cyclopropylene group.

The polymer having a weight average molecular weight of 800 or more, for example, 800 to 100,000, or 1,500 to 50,000, or 2,000 to 30,000, or 3,000 to 20,000 may be used.

The weight average molecular weight can be determined under, for example, the following conditions.

Apparatus: HLC-8320GPC, manufactured by Tosoh Corp.

GPC Column: Shodex [registered trademark]—Asahipak [registered trademark] (Showa Denko K.K.)

Column temperature: 40° C.

Flow rate: 0.35 mL/minute

Eluent: Tetrahydrofuran (THF)

Standard sample: Polystyrene (Tosoh Corp.)

The lithography coating film forming-composition in the present invention and the precursor thereof can be produced by dissolving the components to be contained in the lithography coating film forming-composition in an organic solvent. They can be used in a uniform solution state. The organic solvent is as described above.

<Crosslinkable Compound>

Each of the lithography coating film forming-composition used in the present invention and the precursor thereof preferably contains a crosslinkable compound. Examples of crosslinkable compounds include melamine-based compounds, substituted urea-based compounds, or polymers of each of them, as well as epoxy compounds or a polymer thereof, and blocked isocyanate or a polymer thereof. Preferred is a crosslinkable compound having at least two crosslinkable substituents. Examples thereof include such compounds as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Specific examples include tetramethoxymethylglycoluril. Further, a condensation product of the above compounds may be used.

As the crosslinkable compound, a crosslinking agent having a high heat resistance may be used. As the crosslinking agent having a high heat resistance, a compound containing in the molecule thereof a crosslinkable substituent having an aromatic ring (for example, a benzene ring or a naphthalene ring) may be used.

Examples of such compounds include compounds having a partial structure of formula (5-1) below, and polymers or oligomers having repeating units of formula (5-2) below.

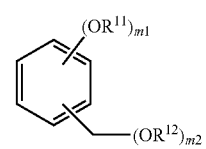

Formula (5-1)

Formula (5-2)

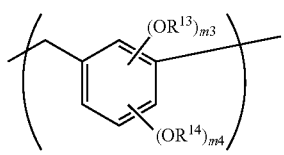

The above $R^{11}$, $R^{12}$, $R^{13}$, and $R^{14}$ are a hydrogen atom or an alkyl group having 1 to 10 carbon atoms, and, with respect to the alkyl group, those mentioned above as examples may be used.

m1 satisfies the relationship: $1 \leq m1 \leq 6-m2$, m2 satisfies the relationship: $1 \leq m2 \leq 5$, m3 satisfies the relationship: $1 \leq m3 \leq 4-m2$, and m4 satisfies the relationship: $1 \leq m4 \leq 3$.

Examples of the compounds, polymers, and oligomers of formulae (5-1) and (5-2) are shown below.

Formula(6-1)

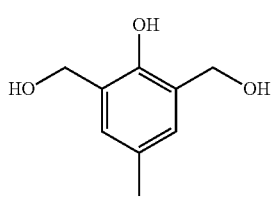

Formula(6-2)

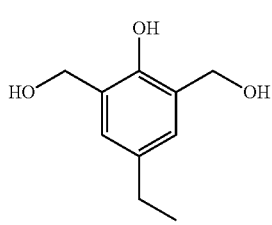

Formula(6-3)

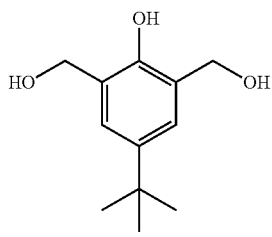

Formula(6-4)

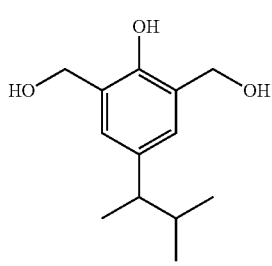

Formula(6-5)

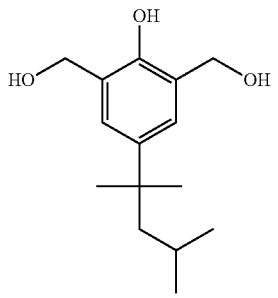

Formula(6-6)

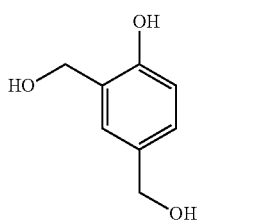

Formula(6-6)

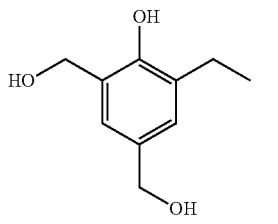

Formula(6-7)

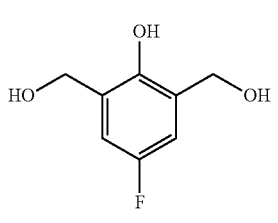

Formula(6-8)

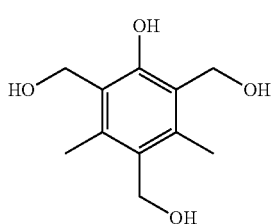

Formula(6-9)

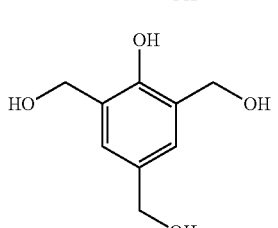

Formula(6-10)

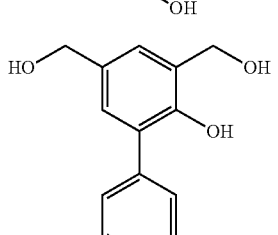

Formula(6-11)
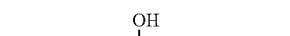
Formula(6-12)
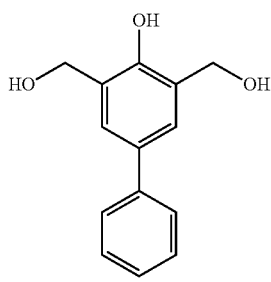
Formula(6-13)
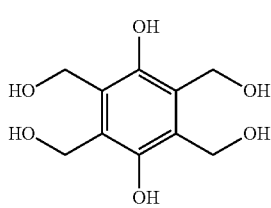
Formula(6-14)
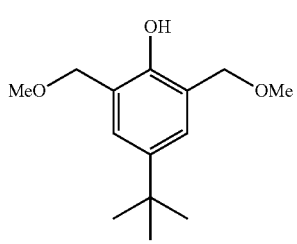
Formula(6-15)
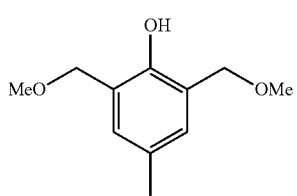
Formula(6-16)
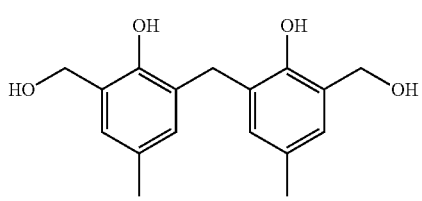
Formula(6-17)
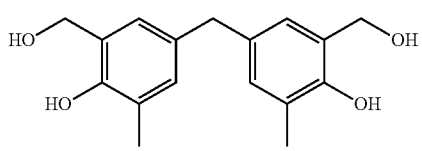
Formula(6-18)
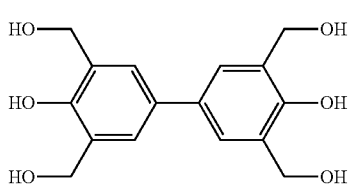
Formula(6-19)
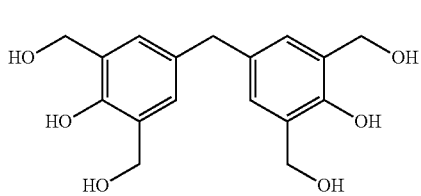
Formula(6-20)
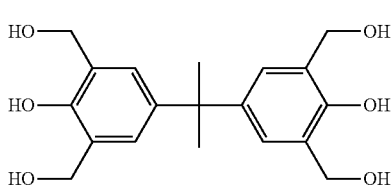
Formula(6-21)
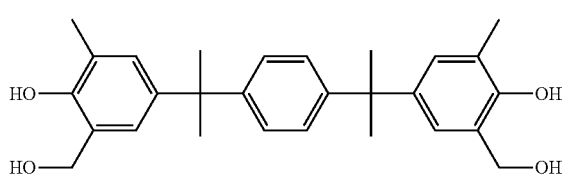
Formula(6-22)
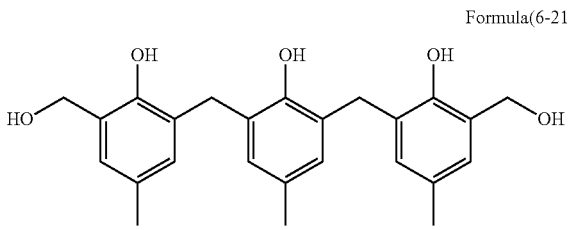
Formula(6-23)
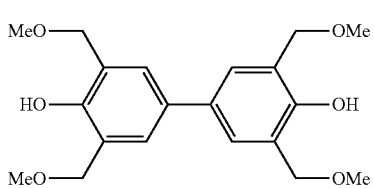
Formula(6-24)
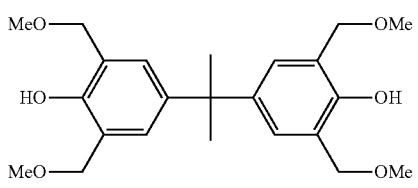
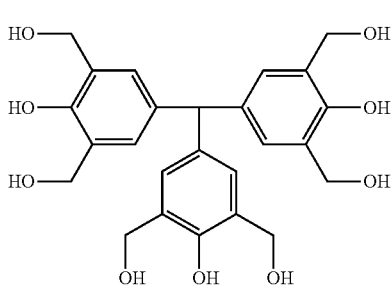

-continued

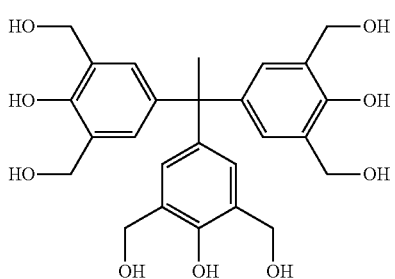

Formula(6-25)

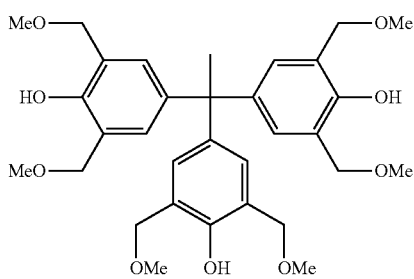

Formula(6-26)

The above compounds are available as products of Asahi Yukizai Corporation and Honshu Chemical Industry Co., Ltd. For example, of the above-mentioned crosslinking agents, the compound of formula (6-22) is available as trade name: TMOM-BP, manufactured by Asahi Yukizai Corporation.

With respect to the crosslinking agent, a compound having at least two epoxy groups may be used. Examples of such compounds include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, diglycidyl 1,2-cyclohexanedicarboxylate, 4,4'-methylenebis(N,N-diglycidylaniline), 3,4-epoxycyclohexylmethyl-3,4-epoxycyclohexanecarboxylate, trimethylolethane triglycidyl ether, bisphenol-A-diglycidyl ether, Epolead (registered trademark) GT-401, Epolead GT-403, Epolead GT-301, Epolead GT-302, Celloxide (registered trademark) 2021, Celloxide 3000, manufactured by Daicel Corporation; 1001, 1002, 1003, 1004, 1007, 1009, 1010, 828, 807, 152, 154, 180S75, 871, 872, manufactured by Mitsubishi Chemical Corporation; EPPN 201, EPPN 202, EOCN-102, EOCN-103S, EOCN-104S, EOCN-1020, EOCN-1025, EOCN-1027, manufactured by Nippon Kayaku Co., Ltd.; Denacol (registered trademark) EX-252, Denacol EX-611, Denacol EX-612, Denacol EX-614, Denacol EX-622, Denacol EX-411, Denacol EX-512, Denacol EX-522, Denacol EX-421, Denacol EX-313, Denacol EX-314, Denacol EX-321, manufactured by Nagase Chemtex Corporation; CY175, CY177, CY179, CY182, CY184, CY192, manufactured by BASF Japan Ltd.; and EPICLON 200, EPICLON 400, EPICLON 7015, EPICLON 835LV, EPICLON 850CRP, manufactured by DIC Corporation.

As the compound having at least two epoxy groups, a polymer having an epoxy group may also be used. There is no particular limitation to the above-mentioned polymer as long as it is a polymer having an epoxy group, and any of such polymers may be used. Such a polymer may be produced by addition polymerization using an addition-polymerizable monomer having an epoxy group. Or such a polymer may be produced by a reaction of a polymer compound having a hydroxy group and a compound having an epoxy group, such as epichlorohydrin or glycidyl tosylate. Examples of the polymers include addition polymerization polymers, such as polyglycidyl acrylate, a copolymer of glycidyl methacrylate and ethyl methacrylate, and a copolymer of glycidyl methacrylate, styrene, and 2-hydroxyethyl methacrylate; and polycondensation polymers, such as epoxy novolak. The polymer has a weight average molecular weight of, for example, 300 to 200,000. The weight average molecular weight is a value determined by gel permeation chromatography (GPC) using polystyrene as a standard sample.

As the compound having at least two epoxy groups, an epoxy resin having an amino group may also be used. Examples of such epoxy resins include YH-434, YH-434L (manufactured by NSCC Epoxy Manufacturing Co., Ltd.) (former Tohto Kasei Co., Ltd.).

As the crosslinking agent, a compound having at least two blocked isocyanate groups may be used. Examples of such compounds include TAKENATE (registered trademark) B-830, TAKENATE B-870N, manufactured by Mitsui Chemicals, Inc., and VESTANAT (registered trademark)-B1358/100, manufactured by Evonik Degussa. The crosslinking agent may be used each alone or in combination of two or more.

The amount of the crosslinkable compound added varies depending on, for example, the application solvent used, the substrate used, the required solution viscosity, or the required film form. However, it is usually within the range of 0.001 to 80% by weight, preferably 0.01 to 50% by weight, further preferably 0.1 to 40% by weight, based on the weight of the solids in the lithography coating film forming-composition or lithography coating film forming-composition precursor. The crosslinkable compound possibly causes a crosslinking reaction due to self-condensation; however, when a crosslinkable substituent is present in the above-mentioned polymer in the present invention, the crosslinkable compound and the crosslinkable substituent can together cause a crosslinking reaction.

<Crosslinking Catalyst>

The lithography coating film forming-composition and the lithography coating film forming-composition precursor in the present invention may contain, as an optional component, a crosslinking catalyst for accelerating the crosslinking reaction. As the crosslinking catalyst, it is possible to use an acidic compound (crosslinking acid catalyst) as well as a compound capable of generating an acid or a base due to heat. As the acidic compound, a sulfonic acid compound or a carboxylic acid compound may be used. As the compound capable of generating an acid due to heat, a thermal acid generator may be used. Of these, a crosslinking acid catalyst is preferably used.

Examples of sulfonic acid compounds or carboxylic acid compounds include ammonium trifluoroacetate, p-toluenesulfonic acid, trifluoromethanesulfonic acid, pyridinium trifluoromethanesulfonate, pyridinium p-toluenesulfonate, pyridinium 4-hydroxybenzenesulfonate, salicylic acid, camphorsulfonic acid, 5-sulfosalicylic acid, 4-chlorobenzenesulfonic acid, 4-hydroxybenzenesulfonic acid, pyridinium 4-hydroxybenzenesulfonate, benzenedisulfonic acid, 1-naphthalenesulfonic acid, 4-nitrobenzenesulfonic acid, citric acid, benzoic acid, and hydroxybenzoic acid.

Examples of thermal acid generators include K-PURE [registered trademark] CXC-1612, K-PURE CXC-1614, K-PURE TAG-2172, K-PURE TAG-2179, K-PURE TAG-2678, K-PURE TAG2689 (each of which is manufactured by King Industries, Inc.), and SI-45, SI-60, SI-80, SI-100, SI-110, SI-150 (each of which is manufactured by Sanshin Chemical Industry Co., Ltd.).

The crosslinking catalyst may be used each alone or in combination of two or more.

When the lithography coating film forming-composition or the precursor thereof contains a crosslinking catalyst, the amount of the crosslinking catalyst contained is usually within the range of 0.0001 to 20% by weight, preferably 0.01 to 15% by weight, further preferably 0.1 to 10% by mass, based on the total mass of the solid content of the lithography coating film forming-composition or the precursor thereof.

<Surfactant>

The lithography coating film forming-composition used in the present invention and the precursor thereof may contain, as an optional component, a surfactant for improving the application properties with respect to a semiconductor substrate. Examples of the surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenyl ether and polyoxyethylene nonyl phenyl ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP [registered trademark] EF301, EFTOP EF303, EFTOP EF352 (manufactured by Mitsubishi Materials Electronic Chemicals Co., Ltd.), MEGAFACE [registered trademark] F171, MEGAFACE F173, MEGAFACE R-30, MEGAFACE R-30N, MEGAFACE R-40, MEGAFACE R-40-LM (manufactured by DIC Corporation), Fluorad FC430, Fluorad FC431 (manufactured by Sumitomo 3M), and AsahiGuard [registered trademark] AG710, Surflon [registered trademark] S-382, Surflon SC101, Surflon SC102, Surflon SC103, Surflon SC104, Surflon SC105, Surflon SC106 (manufactured by AGC Inc.), and organosiloxane polymer KP341 (manufactured by Shin-Etsu Chemical Co., Ltd.). The surfactant may be used each alone or in combination of two or more. When the lithography coating film forming-composition or the precursor thereof contains a surfactant, the amount of the surfactant contained is usually within the range of 0.0001 to 10% by weight, preferably 0.01 to 5% by weight, based on the total weight of the solid content of the lithography coating film forming-composition or the precursor thereof.

<Other Components>

In the lithography coating film forming-composition in the present invention and the precursor thereof, for example, a light absorber, a rheology modifier, or a bonding auxiliary may be incorporated. The rheology modifier is effective in improving the fluidity of the lithography coating film forming-composition and the precursor thereof. The bonding auxiliary is effective in improving the adhesion between a semiconductor substrate or a resist and the resist underlayer film.

The lithography coating film forming-composition after the step of passing the precursor has a water content of 0.3% by weight or less. The better the lower water content of the lithography coating film forming-composition. The water content of the lithography coating film forming-composition is preferably 0.2% by weight or less, 0.15% by weight or less, 0.1% by weight or less, 0.05% by weight or less, and the detection limit or less.

The water content of the lithography coating film forming-composition can be determined, for example, by means of a Karl Fischer moisture content meter.

EXAMPLES

Hereinbelow, the present invention will be described in more detail with reference to the following Examples, which should not be construed as limiting the scope of the present invention.

<Analysis Conditions for Water Content of an Ion-Exchange Resin>

The water content of the ion-exchange resins shown in the examples described below is the result of the measurement made by means of a Karl Fischer moisture content meter. The conditions for the measurement and others are as follows.

Apparatus: Coulometric Karl Fischer moisture content meter CA-200 (Mitsubishi Chemical Analytech Co., Ltd.)

Vaporizing apparatus: Vaporizer VA-200 (Mitsubishi Chemical Analytech Co., Ltd.)

<Description of Abbreviation>

(Organic Solvent)

PGME: Propylene glycol monomethyl ether

Actual measurement value of water content of PGME used in the Examples: 50 to 150 ppm <Washing of an Ion-Exchange Resin>

Example 1

A column having an internal volume of 50 L was filled with 35 L of a strongly acidic cation-exchange resin having a gel type structure, Muromac XSC-1115-H (trade name), manufactured by Muromachi Chemicals Inc., in a wet state. Then, PGME was passed through the column from the upper portion of the column. The rate of passing the PGME was controlled so that the space velocity (SV [$h^{-1}$]) based on the resin-filled layer volume in the column became 3. Then, the operation was performed at room temperature. The total amount of the PGME passed through the column was a weight 8 times the wet weight of the resin filling the column. After completion of passing the PGME, the PGME remaining in the system was removed from the system by blowing nitrogen gas. The result of the measurement of a water content of the obtained ion-exchange resin is shown in Table 1.

Comparative Example 1

The same resin as used in Example 1 was subjected to batch washing. A vessel having an internal volume of 10 L was filled with 1 kg of the ion-exchange resin, in terms of a wet weight. Then, PGME in the same weight as the weight of the filling resin was poured into the vessel, and the resultant mixture was stirred. The stirring time was 4 hours. The operation was performed at room temperature. After completion of stirring, the washing liquid was removed from the vessel by decantation. The above-mentioned operation was repeated three times, provided that only in the second operation, the stirring time was changed to 8 hours or longer. The result of the measurement of a water content of the obtained ion-exchange resin is shown in Table 2.

Comparative Example 2

The same resin as used in Example 1 was subjected to batch washing. A vessel having an internal volume of 10 L was filled with 1 kg of the ion-exchange resin, in terms of a wet weight. Then, PGME in a weight twice the weight of the filling resin was poured into the vessel and the resultant mixture was stirred. The stirring time was 2 hours. The operation was performed at room temperature. After completion of stirring, the washing liquid was removed from the vessel by decantation. The above-mentioned operation was repeated five times, provided that only in the third operation, the stirring time was changed to 8 hours or longer. The result of the measurement of a water content of the obtained ion-exchange resin is shown in Table 3.

Example 2

A strongly acidic cation-exchange resin having an MR type structure, AMBERLYST 15JWET (trade name), manufactured by Organo Corporation, was washed in accordance with the same procedure as in Example 1. The result of the measurement of a water content of the obtained ion-exchange resin is shown in Table 1.

Comparative Example 3

The same resin as used in Example 2 was subjected to the same washing as conducted in Comparative Example 2. The result of the measurement of a water content of the obtained ion-exchange resin is shown in Table 2.

Comparative Example 4

The same resin as used in Example 2 was subjected to the same washing as conducted in Comparative Example 3. The result of the measurement of a water content of the obtained ion-exchange resin is shown in Table 3.

Example 3

A strongly basic anion-exchange resin having a gel type structure, AMBERJET ESG4002(OH) (trade name), manufactured by Organo Corporation, was washed in accordance with the same procedure as in Example 1. The result of the measurement of a water content of the obtained ion-exchange resin is shown in Table 1.

Comparative Example 5

The same resin as used in Example 3 was subjected to the same washing as conducted in Comparative Example 1. The result of the measurement of a water content of the obtained ion-exchange resin is shown in Table 2.

Comparative Example 6

The same resin as used in Example 3 was subjected to the same washing as conducted in Comparative Example 3. The result of the measurement of a water content of the obtained ion-exchange resin is shown in Table 3.

TABLE 1

| Example (Cleaning by passing liquid) | Name of ion-exchange resin | Space velocity [1/h] | Initial water content [wt %] | Water content after cleaning [wt %] | Dehydration rate [%] | Cleaning time [h] | Cleaning liquid amount [kg/kg-Initial wet resin] | Dehydration efficiency [%/((kg/kg) · h)] |
|---|---|---|---|---|---|---|---|---|
| 1 | Muromac XSC-1115-H | 3 | 48 | 5 | 94 | 2 | 8 | 6 |
| 2 | AMBERLYST 15JWET | 3 | 54 | 2 | 98 | 2 | 8 | 6 |
| 3 | AMBERJET ESG4002(OH) | 3 | 67 | 1 | 100 | 2 | 8 | 6 |

(*Initial water content: indicates a water content of the uncleaned resin; Dehydration rate: indicates a water content reduction rate by cleaning)

TABLE 2

| Comparative Example (Batch cleaning) | Name of ion-exchange resin | Space velocity [1/h] | Initial water content [wt %] | Water content after cleaning [wt %] | Dehydration rate [%] | Cleaning time [h] | Cleaning liquid amount [kg/kg-Initial wet resin] | Dehydration efficiency [%/((kg/kg) · h)] |
|---|---|---|---|---|---|---|---|---|
| 1 | Muromac XSC-1115-H | Batch cleaning | 48 | 16 | 79 | ≥16 | 3 | 2 |
| 3 | AMBERLYST 15JWET | Batch cleaning | 54 | 13 | 87 | ≥16 | 3 | 2 |
| 5 | AMBERJET ESG4002(OH) | Batch cleaning | 67 | 24 | 84 | ≥16 | 3 | 2 |

TABLE 3

| Comparative Example (Batch cleaning) | Name of ion-exchange resin | Space velocity [1/h] | Initial water content [wt %] | Water content after cleaning [wt %] | Dehydration rate [%] | Cleaning time [h] | Cleaning liquid amount [kg/kg-Initial wet resin] | Dehydration efficiency [%/((kg/kg) · h)] |
|---|---|---|---|---|---|---|---|---|
| 2 | Muromac XSC-1115-H | Batch cleaning | 48 | 8 | 91 | ≥16 | 10 | 1 |
| 4 | AMBERLYST 15JWET | Batch cleaning | 54 | 6 | 95 | ≥16 | 10 | 1 |
| 6 | AMBERJET ESG4002(OH) | Batch cleaning | 67 | 6 | 97 | ≥16 | 10 | 1 |

As can be seen from Tables 1, 2, and 3, the water content of the ion-exchange resin was able to be efficiently reduced in the case using washing by passing the washing liquid in Examples 1 to 3. In contrast, the washing efficiency was poor and the residual water content was large in the case using batch washing in Comparative Examples 1 to 6. Therefore, it is seen that batch washing is not practical. Although the inventors do not wish to be bound by theory, the reason for this is presumed as follows. In batch washing, the washing liquid is removed from the system by decantation, and therefore the washing liquid having a high water content remains in the vessel. In contrast, in washing by passing the washing liquid, a virgin washing liquid is continuously fed to the resin layer, and therefore high washing efficiency is achieved.

Synthesis Example 1

800 g of monoallyldiglycidylisocyanuric acid (manufactured by Shikoku Chemicals Corporation), 608 g of 3,3'-dithiodipropionic acid (manufactured by Sakai Chemical Industry Co., Ltd.; trade name: DTDPA), and, as a catalyst, 53 g of triphenylmonoethylphosphonium bromide, which is a quaternary phosphonium salt, were dissolved in 2,191 g of propylene glycol monomethyl ether. The resultant solution was heated and then stirred in a nitrogen gas atmosphere for 4 hours while maintaining the temperature at 120° C. The obtained reaction product was diluted with 3,652 g of propylene glycol monomethyl ether. The resultant varnish solution was subjected to GPC analysis. As a result, the reaction product was found to have a weight average molecular weight of about 7,800, as determined by GPC using a conversion calibration curve obtained from the standard polystyrene. The reaction product contained a polymer compound having a structural unit represented by the following formula (A-1).

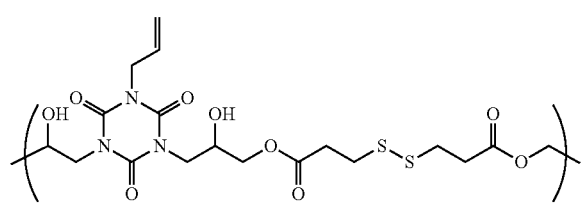

(A-1)

Preparation Example 1

To 3,575 g of a solution containing 715 g of the polymer compound obtained in Synthesis Example 1 above were added 179 g of tetramethoxymethylglycoluril [POWDER-LINK (registered trademark) 1174, manufactured by Nihon Cytec Industries Inc.], 18 g of 4-hydroxybenzenesulfonic acid (PSA), 11 g of bisphenol S, 7 g of a surfactant (R-30N, DIC Corporation), 86.3 kg of propylene glycol monomethyl ether, and 9.9 kg of propylene glycol monomethyl ether acetate to prepare a resist underlayer film forming-composition.

<Analysis Conditions for Water Content of an Ion-Exchange Treated Solution>

The water content of the ion-exchange treated solutions shown in the examples described below is the result of the measurement made by means of a Karl Fischer moisture content meter. The conditions for the measurement and others are as follows.

Apparatus: Coulometric Karl Fischer moisture content meter CA-200 (Mitsubishi Chemical Analytech Co., Ltd.)

Example 4

To 500 g of the resist underlayer film forming-composition obtained in Preparation Example 1 above was added 25 g of the ion-exchange resin obtained in Example 1. The resultant mixture was stirred at room temperature for 2 hours. Then, the resin was removed by decantation to obtain a treated solution (purified solution). The result of the measurement of a water content of the obtained treated solution is shown in Table 4.

Comparative Example 7

The same operation as in Example 4 was performed using the ion-exchange resin obtained in Comparative Example 1. The result of the measurement of a water content of the obtained treated solution is shown in Table 4.

TABLE 4

| Details | Name of ion-exchange resin | Cleaning manner for resin | Water content of solution [wt %] |
|---|---|---|---|
| Untreated | — | — | 0.29 |
| Example 4 | Muromac XSC-1115-H | Cleaning by passing liquid | 0.28 |
| Comparative Example 7 | Muromac XSC-1115-H | Batch cleaning (3 Times) | 0.67 |

(*Untreated: indicates the resist underlying film forming composition which has not been subjected to ion-exchange treatment)

INDUSTRIAL APPLICABILITY

According to the method of the present invention, there are provided a method for producing a lithography coating film forming-composition having a reduced water content, and a method for washing an ion-exchange resin having a reduced water content used for producing the composition.

The invention claimed is:

1. A method for producing an ion-exchange resin having a water content of 5% by weight or less, comprising passing an organic solvent having a water content of 150 ppm or less through a system including a column of an ion-exchange resin precursor having a water content of 40% by weight or more, with only a single frequency of passing the organic solvent through the column, and then removing the organic solvent remaining in the system from the system by blowing nitrogen gas, wherein a dehydration efficiency defined by the following equation is 5 or more:

dehydration efficiency=dehydration rate (%)/[weight of the organic solvent used per unit weight of the ion-exchange resin precursor (kg/kg)×washing time (h)], and wherein, in the passing of the organic solvent, the organic solvent is passed in a rate of passing of 3 ($h^{-1}$) or less, in terms of a space velocity based on an ion-exchange resin-filled layer volume.

2. A method for producing a lithography coating film forming-composition, comprising subjecting a lithography coating film forming-composition precursor to ion-exchange treatment using an ion-exchange resin having a water content of 5% by weight or less, wherein the ion-exchange resin having a water content of 5% by weight or less is produced by a method comprising passing an organic solvent having a water content of 150 ppm or less through a system including a column of an ion-exchange resin precursor having a water content of 40% by weight or more with only a single frequency of passing the organic solvent through the column, and then removing the organic solvent remaining in the system from the system by blowing nitrogen gas, and wherein a dehydration efficiency defined by the following equation is 5 or more:

dehydration efficiency=dehydration rate (%)/[weight of the organic solvent used per unit weight of the ion-exchange resin precursor (kg/kg)×washing time (h)].

3. A method for producing a lithography coating film forming-composition, comprising subjecting a lithography coating film forming-composition precursor to ion-exchange treatment using an ion-exchange resin having a water content of 5% by weight or less, wherein the ion-exchange resin having a water content of 5% by weight or less is produced by a method comprising passing an organic solvent having a water content of 150 ppm or less through a system including a column of an ion-exchange resin precursor having a water content of 40% by weight or more, with only a single frequency of passing the organic solvent through the column, and then removing the organic solvent remaining in the system from the system by blowing nitrogen gas, wherein a dehydration efficiency defined by the following equation is 5 or more:

dehydration efficiency=dehydration rate (%)/[weight of the organic solvent used per unit weight of the ion-exchange resin precursor (kg/kg)×washing time (h)], wherein, in passing the organic solvent, the organic solvent is passed in a rate of passing of 3 ($h^{-1}$) or less, in terms of a space velocity based on an ion-exchange resin-filled layer volume, and wherein the lithography coating film forming-composition is a resist underlayer film forming-composition.

4. The method for producing a lithography coating film forming-composition according to claim 3, wherein the lithography coating film forming-composition after the ion-exchange treatment, the precursor has a water content of 0.3% by weight or less.

5. The method for producing a lithography coating film forming-composition according to claim 3, wherein the lithography coating film forming-composition comprises a polymer.

6. The method for producing a lithography coating film forming-composition according to claim 3, wherein the lithography coating film forming-composition further comprises at least one member selected from the group consisting of a crosslinkable compound, a crosslinking catalyst, and a surfactant.

7. A method for washing an ion-exchange resin, comprising passing an organic solvent having a water content of 150 ppm or less through a system including a column of the ion-exchange resin, with only a single frequency of passing the organic solvent through the column, and then removing the organic solvent remaining in the system from the system by blowing nitrogen gas, wherein the ion-exchange resin is exclusively used for producing a lithography coating film forming-composition, and wherein a dehydration efficiency defined by the following equation before and after washing the ion-exchange resin is 5 or more:

Dehydration efficiency=Dehydration rate (%)/ [Weight of the organic solvent used per unit weight of the ion-exchange resin precursor (kg/kg)×Washing time (h)].

8. A method for producing a lithography coating film forming-composition, comprising subjecting a lithography coating film forming-composition precursor to ion-exchange treatment using the ion-exchange resin washed by the method according to claim 7.

9. The method for producing a lithography coating film forming-composition according to claim 8, wherein the lithography coating film forming-composition after the step for ion-exchange treatment has a water content of 0.3% by weight or less.

* * * * *